United States Patent [19]
Suzuki

[11] Patent Number: 5,881,748
[45] Date of Patent: Mar. 16, 1999

[54] APPARATUS FOR RINSING WAFERS ADHERED WITH CHEMICAL LIQUID BY USE OF PURIFIED WATER

[75] Inventor: Kuniyoshi Suzuki, Fukushima-ken, Japan

[73] Assignee: Shin-Etsu Handotai Co. Ltd., Tokyo, Japan

[21] Appl. No.: 842,892

[22] Filed: Apr. 17, 1997

Related U.S. Application Data

[62] Division of Ser. No. 395,069, Feb. 27, 1995, Pat. No. 5,651,836.

[30] Foreign Application Priority Data

Mar. 28, 1994 [JP] Japan ........................................ 6-82349

[51] Int. Cl.⁶ ....................................................... B08B 3/04
[52] U.S. Cl. .......................... 134/99.1; 134/155; 134/186; 134/902
[58] Field of Search .................... 134/155, 186, 134/902, 94.1, 99.1, 182

[56] References Cited

U.S. PATENT DOCUMENTS

| | | |
|---|---|---|
| 4,997,490 | 3/1991 | Vetter . |
| 5,069,235 | 12/1991 | Vetter . |
| 5,088,510 | 2/1992 | Bannon ................................... 134/902 |
| 5,488,964 | 2/1996 | Murakami et al. ...................... 134/902 |

FOREIGN PATENT DOCUMENTS

| | | |
|---|---|---|
| 0 289 875A | 11/1988 | European Pat. Off. . |
| 0 526 245 | 2/1993 | European Pat. Off. . |
| 59-046032 | 3/1984 | Japan . |
| 61-069983 | 4/1986 | Japan . |
| 61-141143 | 6/1986 | Japan ..................................... 134/902 |
| 61-281532 | 12/1986 | Japan ..................................... 134/902 |
| 1-241824 | 9/1989 | Japan ..................................... 134/902 |
| 1264226 | 10/1989 | Japan ..................................... 134/902 |
| 02 044727 | 2/1990 | Japan . |
| 04 042531 | 2/1992 | Japan . |
| 04 171725 | 6/1992 | Japan . |
| 04 196535 | 7/1992 | Japan . |
| 4-192419 | 7/1992 | Japan ..................................... 134/902 |
| 4-196535 | 7/1992 | Japan ..................................... 134/902 |
| 4-278529 | 10/1992 | Japan ..................................... 134/902 |
| 4-290432 | 10/1992 | Japan ..................................... 134/902 |

OTHER PUBLICATIONS

IBM Technical Disclosure Bulletin, vol. 32, No. 3A, Aug. 1989, "Acetic Acid Spray Rinse for Removing Developed Resist Residuals from a Wafer Surface" Aug. 1981.

*Primary Examiner*—Frankie L. Stinson
*Attorney, Agent, or Firm*—Ronald R. Snider

[57] ABSTRACT

A method for rinsing wafers having residual chemical liquid adhering thereto with purified water is disclosed which is characterized by the steps of preparing a rinsing tank provided in the upper part thereof with an overflow discharge part for spent rinsing liquid and a head tank disposed above the rinsing tank, storing purified water for rinse in the head tank, setting in place in the rinsing tank a basket having a plurality of wafers stowed therein parallelly as suitably spaced in such a manner that the surfaces of the wafers may lie substantially vertically, feeding the purified water from the headtank to the rinsing tank by virtue of head, causing the purified water to flow upward from below the basket, and enabling the spent rinsing liquid to be discharged through the overflow discharge part in an amount equivalent to part or the whole of the purified water fed from the head tank.

5 Claims, 10 Drawing Sheets

FIG. 17

APPARATUS FOR RINSING WAFERS ADHERED WITH CHEMICAL LIQUID BY USE OF PURIFIED WATER

This is a division of application Ser. No. 08/395,069 filed Feb. 27, 1995, now U.S. Pat. No. 5,651,836.

BACKGROUND OF THE INVENTION

1. Field of the Invention

This invention relates to a method for rinsing single crystal wafers such as of silicon or compound semiconductors and an apparatus for rinsing the wafers. More particularly, this invention relates to a method and an apparatus for washing with purified water silicon wafers which have been washed or etched with a chemical liquid thereby removing from the surfaces of the silicon wafers the chemical liquid still remaining thereon.

2. Description of the Prior Art

Heretofore, in the process for the production of single crystal wafers of silicon, for example, the silicon wafers (hereinafter occasionally referred to briefly as "wafers") which have been washed or etched with such a chemical liquid as an alkali solution or an acid solution were immediately rinsed with purified water without being preparatorily dried by draining.

Figure 3:
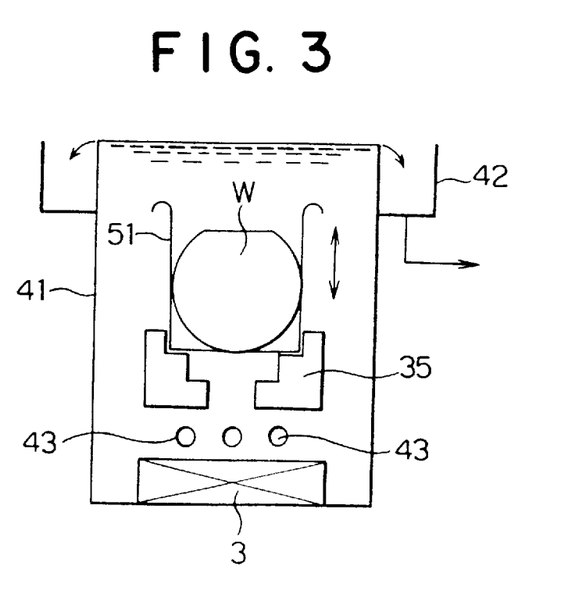
FIG. 3 is an explanatory diagram of a conventional method of rinse.

As an example of method of rinse, there is a multistage manual shaking rinse method. This method will be described below. A plurality of rinsing tanks 41 each provided in the upper part thereof with an overflow discharge part 42 for spent rinsing liquid and in the inner lower part thereof with spouting nozzles 43 for spouting purified water upward are arranged as shown in FIG. 3. A plurality of wafers W after being treated with a chemical liquid are stowed parallelly as suitably spaced in a basket 51 held in place by a retaining member 35 and purified water is fed upward through the spouting nozzles 43. In each rinsing tanks 41 filled with purified water, the basket 51 is manually shaken in a vertical direction. The rinsing action given as described above to the basket 51 is sequentially performed in the plurality of rinsing tanks. The whole operation just described constitutes the multistage manual shaking rinse method. The rinsing tank 41 shown in FIG. 3 is provided therein with an ultrasonic oscillator 3.

In this rinse method, since the purified water is not fed amply to wafers retaining groove parts (not shown ) in the basket 51, the purified water in these groove parts is not sufficiently displaced with fresh supply and the chemical liquid removed from the wafers W is not quickly discharged out of the rinsing tank 41 but is suffered to mingle with the purified water and stagnate inside the rinsing tank 41, with the result that the chemical liquid will tend to persist on the surfaces of the wafers W. The rinse method under consideration, therefore, has the problem that the surfaces of the wafers W which have undergone the multistage rinse are blemished (as by surface roughness, protrusions, and pits presumably caused by the etching reaction of the chemical liquid) and consequently made to assume an bad appearance. This method, therefore, is at a disadvantage in requiring to increase the number of rinsing tanks 41 for use in the multistage operation in order to ensure perfect rinse and inevitably turning the rinsing operation into a troublesome and time-consuming work.

SUMMARY OF THE INVENTION

This invention has been produced in association with the drawbacks of the prior art mentioned above. It is aimed at providing a method and an apparatus for rinsing wafers W exactly in the true sense of the word by a simple construction.

This invention consists in exalting the efficiency of rinse of wafers W by introducing purified water from a head tank into a rinsing tank by virtue of head, causing the purified water to flow upward at a high flow rate along the surfaces of wafers stowed inside the rinsing tank, and enabling the chemical liquid removed from the wafers W to be quickly discharged out of the rinsing tank.

The first aspect of this invention resedes in a method for rinsing wafers adhered with residual chemical liquid by the use of purified water, which is characterized by the steps of preparing a rinsing tank provided in the upper part thereof with an overflow discharge part for spent rinsing liquid, and a head tank disposed above the rinsing tank, storing purified water for rinse in the head tank, setting in place in the rinsing tank a basket having a plurality of wafers stowed therein parallelly as suitably spaced in such a manner that the surfaces of the wafers may lie substantially vertically, feeding the purified water in the head tank to the rinsing tank by virtue of head, causing the purified water to flow upward from below the basket, and enabling the spent rinsing liquid to be discharged through the overflow discharge part in an amount equivalent to part or the whole of the purified water fed from the head tank.

The second aspect of this invention resides in a method for rinsing wafers adhered with residual chemical liquid by the use of purified water, wherein the feed of purified water from the head tank to the rinsing tank is so effected that the amount of feed, Q, may be in the range of from 0.2 V to 3 V, wherein V stands for the capacity of the rinsing tank for retaining the purified water, and the average linear velocity, v, to be found by the following formula (1) may exceed 1 cm/sec, and preferably fall in the range of from 2 to 3 cm/sec.

$$v(\text{cm/sec}) = Q/(S \cdot t) \tag{1}$$

wherein Q stands for the amount of purified water (cm$^3$) fed to the rinsing tank, S for the cross-sectional area (cm$^2$) of the part in which the purified water flows upward in the rinsing tank, and t for the time (sec) for feeding the purified water to the rinsing tank.

The third aspect of this invention resides in a method for rinsing wafers adhered with residual chemical liquid by the use of purified water, wherein the temperature of the purified water is not less than 0° C. and not more than 30° C.

The fourth aspect of this invention resides in an apparatus for rinsing wafers, which is characterized by comprising a head tank for retaining purified water for rinse, a rinsing tank provided in the upper part thereof with an overflow discharge part for spent rinsing liquid, and purified water feed pipes for feeding purified water endowed with head from the head tank to the rinsing tank.

The fifth aspect of this invention resides in an apparatus for rinsing wafers, which is characterized in that a rinsing tank is composed of a head tank for retaining purified water for rinse, an outer tank body provided in the upper part thereof with an overflow discharge part for spent rinsing liquid, and an inner tank body furnished on a bottom plate thereof with opening parts and provided with a retaining member for retaining therein a basket stowing wafers to be rinsed, the rinsing tank has the inner tank body thereof inserted in the outer tank body thereof, a partitioned chamber is formed between the inner peripheral surface of the outer tank body and the outer peripheral surface of the inner tank body, the lower end parts of purified water feed pipes for feeding purified water by virtue of head from the head tank are disposed as inserted into the partitioned chamber, and flow paths for purified water are formed as extended from the purified water feed pipes through the upper part of the partitioned chamber, the bottom part of the partitioned chamber, and the opening parts of the bottom plate of the inner tank body to the upper part of the inner tank body.

The sixth aspect of this invention resedes in an apparatus for rinsing wafers, wherein opening parts are formed in the lower end part of the peripheral wall of the inner tank body in addition to the opening parts formed in the bottom plate of the inner tank body.

The seventh aspect of this invention resides in an apparatus for rinsing wafers, wherein spouting nozzles for spouting purified water are provided between the bottom plate of the outer tank body and the bottom plate of the inner tank body.

The eighth aspect of this invention resides in an apparatus for rinsing wafers, which comprises a head tank for retaining purified water for rinse, a rinsing tank provided in the upper part thereof with an overflow discharge part for discharging spent rinsing liquid, purified water feed pipes of which lower end parts are inserted into the rinsing tank for feeding purified water endowed with head from the head tank to the rinsing tank, and nozzle pipes disposed as extended from the leading end parts of the purified water feed pipes.

The ninth aspect of this invention resides in an apparatus for rinsing wafers, wherein a perforated spouting plate is formed in the horizontal direction in the lower part of the rinsing tank to give rise to a partitioned chamber in the bottom part of the rinsing tank and the purified water feed pipes are made to communicate with the partitioned chamber.

BRIEF DESCRIPTION OF THE DRAWINGS

The invention will be better understood and the objects and features thereof other than those set forth above will become apparent when consideration is given to the following detailed description thereof, which makes reference to the annexed drawings wherein.

DETAILED DESCRIPTION OF THE PREFERRED EMBODIMENT

In the first aspect of this invention, since the purified water in the head tank is fed by virtue of head upward at a high flow rate from below the basket, the flow and the displacement of the purified water in the groove parts of the basket for retaining wafers are accelerated. Further, since the purified water enveloping the wafers W is pushed up by the purified water being fed from below and then caused to be discharged by overflow, the chemical liquid removed from the wafers W is rapidly displaced by the purified water and discharged out of the rinsing tank.

In the second aspect of the present invention, since the amount of purified water to be supplied and the flow rate of purified water so supplied are set in suitable ranges, the chemical liquid removed from the wafers W is very quickly and efficiently displaced by the purified water and discharged out of the rinsing tank. As a result, rinse of high precision can be attained by a simple procedure and quickly.

In the third aspect of this invention, since the rinse is made with purified water at a temperature of not more than 30° C., the possibility that the uncalled-for reaction will occur between the chemical liquid stagnating in the rinsing liquid and the wafers W is precluded.

In the fourth aspect of this invention, the purified water introduced from the head tank through the purified water feed pipes into the rinsing tank is caused to flow upward via the bottom part of the rinsing tank, the head between the head tank and the outlets of the purified water feed pipes directly contributes to increase the linear speed of the upward flow of the purified water, and the chemical liquid removed from the surfaces of wafers is quickly displaced by the purified water.

In the fifth aspect of this invention, the purified water introduced from the head tank through the purified water feed pipes into the partitioned chamber is caused to flow upward via the opening parts in the upper part of the partitioned chamber, the bottom part of the partitioned chamber, and the bottom plate to the upper part of the bottom plate, the head between the head tank and the outlets of the purified water feed pipes directly contributes to increase the linear speed of the upward flow of the purified water, and the chemical liquid removed from the surfaces of wafers is quickly displaced by the purified water.

In the sixth aspect of this invention, the effect of rinse is improved because the upward flow of purified water is formed from the opening parts in the bottom plate of the inner tank body and the upward flow of purified water is formed from the opening parts in the lower endpart of the peripheral wall.

In the seventh aspect of this invention, the rinse can be attained to a heightened degree because the rinse by the purified water of a high flow rate is coupled with the rinse by the purified water emitted through the spouting nozzles.

In the eighth aspect of this invention, the purified water introduced from the head tank through the purified water feed pipes and the nozzle pipes into the rinsing tank is caused to flow upward via the orifice of the nozzle pipe to the upper part of the rinsing tank, the head between the head tank and the nozzle of the nozzle pipe directly contributes to increase the linear speed of the upward flow of the purified water, and the chemical liquid removed from the surfaces of wafers is quickly displaced by the purified water.

In the ninth aspect of this invention, the purified water introduced from the head tank through the purified water feed pipes into the partitioned chamber is caused to flow upward via the holes in the spouting plate to the upper part of the rinsing tank, the head between the head tank and the holes in the spouting plate directly contributes to increase the linear speed of the upward flow of the purified water, and the chemical liquid removed from the surfaces of wafers is quickly displaced by the purified water.

Now, this invention will be described more specifically below with reference to preferred embodiments illustrated in the annexed drawings.

EXAMPLE 1

Figure 1:
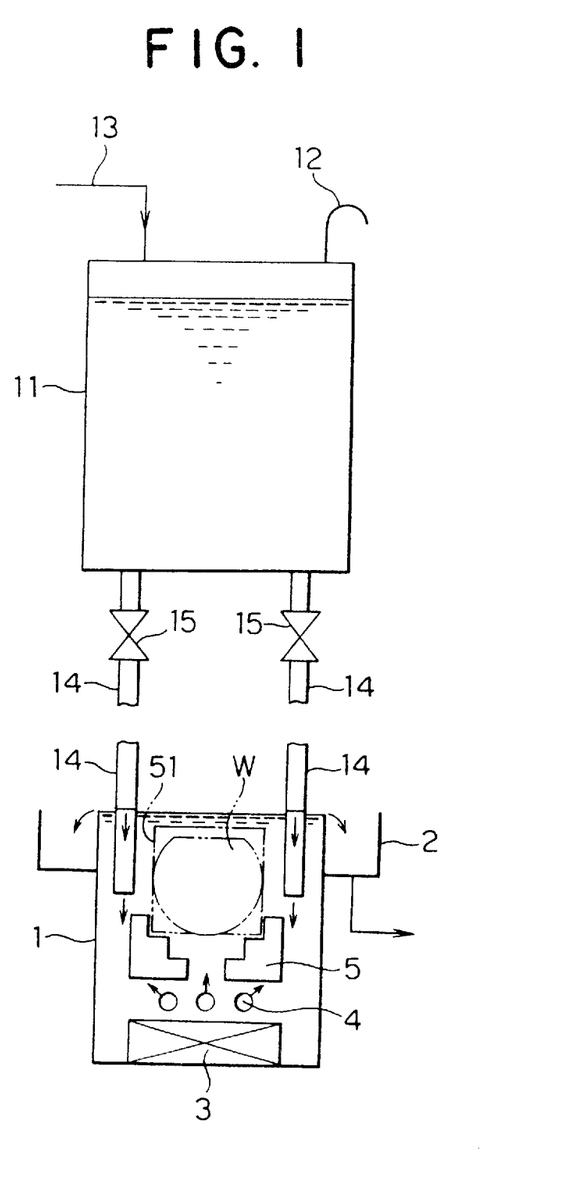
FIG. 1 is a cross section illustrating schematically one example of an apparatus for rinse to be used in embodying this invention.

FIG. 1 is a cross section schematically illustrating part of an apparatus for rinse to be used in embodying this invention, i.e. one stage in a multistage rinsing apparatus. As illustrated in the diagram, a cylindrical rinsing tank 1 comprises an overflow discharge part 2 for spent rinsing liquid disposed in the upper part thereof, an ultrasonic oscillator 3 disposed at the center of the bottom part thereof, a plurality of spouting nozzles 4 disposed directly above the ultrasonic oscillator 3 and adapted to spout purified water upward, and a retaining member 5 disposed directly above the spouting nozzles 4 and adapted to retain a basket 51 shown in FIG. 3.

A head tank 11 disposed directly above the rinsing tank 1 is provided in the upper part thereof with an air vent pipe 12 and a purified water inlet pipe 13 for introducing purified water and in the bottom part thereof with two purified water feed pipes 14. The purified feed pipes 14 are severally provided with a solenoid valve 15. The lower parts of the purified water feed pipes 14 are immersed in the purified water in the rinsing tank 1 and positioned near the inner peripheral surface of the rinsing tank 1.

Here, the work of rinsing wafers W will be outlined. In the same manner as shown in FIG. 3, a plurality of wafers W given to be rinsed are stowed preparatorily in a basket 51 as suitably spaced and arranged parallelly. Then, each of the head tanks 11 is made to retain a prescribed amount of purified water and each of the rinsing tanks 1 is filled with purified water wholly or nearly to capacity.

Then, the basket 51 is fixed to the retaining member 5 of the rinsing tank 1 of the first stage and the wafers W in the basket 51 are consequently set upright substantially in the vertical direction. The feed of purified water from the spouting nozzles 4 is started and, at the same time, the solenoid valve 15 is opened to feed a prescribed amount of purified water from the head tank 11 through the purified water feed pipes 14 to the rinsing tank 1 by virtue of head. In this case, the amount of purified water to be fed from the head tank 11 to the rinsing tank 1 can be fixed by fixing the amount of purified water to be preparatorily retained in the head tank and, at the same time, fixing the time of keeping the solenoid valve 15 in the opened state.

The purified water emanating from the spouting nozzles 4 is caused to flow upward along the surfaces of the wafers W. The purified water issuing from the head tank 11 flows down along the neighborhood of the inner peripheral surface of the rinsing tank 1 toward the bottom part, changes the direction of flow thereof and begins to flow upward in the direction of the wafers W. The chemical liquid removed from the surfaces of the wafers W is entrained by the upward flow of the purified water and eventually discharged out of the rinsing tank 1 via the overflow discharge part 2.

In this case, the efficiency of displacement of purified water in the rinsing tank 1 is improved because the purified water defiled by the chemical liquid in the preceding stage and now stagnating in the part of the rinsing tank 1 below the spouting nozzles 4 is displaced and caused to flow upward by the purified water rapidly flowing down in a large amount from the spouting nozzles 4 of the rinsing tank 1 and the purified water in the rinsing tank above the spouting nozzles 4 is pushed up in a fixed direction and smoothly discharged in the form of overflow by the purified water fed upward from below. As a result, the efficiency of rinse is notably improved because the newly fed purified water flows smoothly to the wafer retaining groove parts (not shown) in the basket 51, the purified water in the groove parts is displaced thoroughly, and moreover the chemical liquid removed from the surfaces of the wafers W is displaced with the purified water and quickly discharged out of the rinsing tank 1.

After the rinse in the first stage performed as described above is completed, the basket 51 is extracted from the rinsing tank 1 and then fixed on a retaining member 5 in the rinsing tank 1 of the second stage in the same manner as in the rinse of the first stage. Then the feed of purified water from the spouting nozzles 4 is started and, at the same time, the solenoid valve 15 is opened to feed the purified water from the head tank 11 in a prescribed amount to the rinsing tank 1 by virtue of head. The third and subsequent stages of rinse will be carried out in the same manner as described above.

In the example described above, the number of rinsing tanks 1 equal that of head tanks 11. Optionally, one large head tank may be installed and adapted to feed purified water to rinsing tanks of sequential stages.

Further, in the examples described above, the feed of purified water is started after the basket 52 has been wholly immersed in the purified water held in the rinsing tank 1. Optionally, the feed of purified water may be started after the basket 51 has been set in the rinsing tank 1 which retains absolutely no purified water or retains purified water to an extent of submerging part of the basket 51. Though the latter rinsing method entails an increase in the amount of purified water to be fed from the head tank 11 as compared with the former rinsing method, it is at an advantage in permitting easy control of the diffusion of the chemical liquid in the purified water in the process of rinse because the feed of purified water is started while the basket 51 has not been immersed in the purified water in the rinsing tank 1.

In any event, it is important that the chemical liquid adhering to the wafers W be removed from the wafers W and discharged in the form of overflow out of the rinsing tank 1 in the smallest possible span of time.

Test Example 1

The apparatus of FIG. 1 was operated (1) with the lower end parts of the purified water feed pipes 14 set at a small distance below the surface of the overflow liquid in the rinsing tank land (2) with the lower end parts of the purified water feed pipes 14 set at about one half of the depth of the rinsing tank 1 from the surface of the overflow liquid in the rinsing tank 1, to compare the effect of rinse in the two cases mentioned above.

Two sets of baskets each having stowed therein 25 wafers W (150 mm in diameter) which had been washed with an alkali were prepared for use in the two cases mentioned above. These baskets were set in a rectangular rinsing tank 1 (25 cm in width, 50 cm in length, and 40 cm in height) having a volume of 50 liters (amount of purified water retained to full capacity, namely the capacity, V, for retaining purified water mentioned above) and a cross-sectional area of 1250 cm². To the baskets, 25 liters of purified water was fed from a head tank 11 over a period of 15 seconds (in which case, the amount, Q, of purified water to be fed was 0.5 V, the flow volume of purified water was 1.67 liters/ second, and the average linear velocity, v, of purified water flowing along the surfaces of wafers was 1.3 cm/sec) and a total of 10 liters of purified water was fed from three spouting nozzles 4 over a period of 15 seconds. In this case, the time for feeding purified water from the spouting nozzles 4 was 15 seconds.

All the wafers W rinsed as described above were taken as samples. The surfaces of these samples were visually examined for appearance as illuminated by a focussed beam of light.

By the examination, though the difference in the means of feeding purified water in the two cases (1) and (2) mentioned above was not found to produce a discernible difference in the number of defiled wafers, the wafers W of the case of (2) were found to have a smooth surface as compared with those of the case of (1). This difference in surface condition may be logically explained by a supposition that in the method of feeding of the case of (1), the purified water fed to the surface of the liquid in the rinsing tank 1 interfered with smooth flow of the overflow liquid near the liquid surface. For this invention, therefore, the lower end parts of the purified water feed pipes 14 are desired to be positioned below the surface of the overflow liquid in the rinsing tank 1.

Test Example 2

The feed of purified water from the head tank 11 to the rinsing tank 1 was carried out by the procedure of the case of (2) mentioned above to determine the relation between the total amount of purified water fed per batch of rinse and the linear velocity of purified water fed during the rinsing operation and the effect of rinse. The apparatus for rinse, the specification of baskets, the dimensions and quantity of wafers W subjected to rinse, and the procedure of inspection of rinsed wafers W for appearance were identical to those used in Test Example 1. The conditions of rinse and the results are shown in Table 1.

TABLE 1

| Total amount, Q (liter), of purified water fed from head tank (calculated value of Q, based on V = 50 liters) | Flow volume of purified water fed from head tank (average linear velocity) | | | |
|---|---|---|---|---|
| | 1.67 liters/sec. (1.14 cm/sec) with two solenoid valves both opened | | 0.83 liter/sec. (0.57 cm/sec) with one solenoid valve alone opened | |
| | n | Number of wafers defiled | n | Number of wafers defiled |
| 10 (0.2 V) | 25 | 0 | 25 | 6 |
| 15 (0.3 V) | 25 | 0 | 25 | 5 |
| 20 (0.4 V) | 25 | 0 | 25 | 2 |
| 35 (0.7 V) | 25 | 0 | — | — |

It is clerly noted from Table 1 that thorough rinse is attained by fixing the total amount, Q, of purified water fed from the head tank at 10 liters (0.2 V) where the flow volume of purified water to be fed is 1.67 liters/second (in which case the average linear velocity of purified water is 1.14 cm/sec.), whereas no sufficient rinse is attained by fixing the total amount of purified water fed from the head tank at 20 liters where the flow volume of purified water to be fed is 0.83 liter/second (in which case the average linear velocity of purified water is 0.57 cm/sec.).

The data indicate that the rinsing effect is affected more conspicuously by the flow volume of purified water to be fed (average linear velocity) than by the total amount of purified water to be fed. In other words, it may be safely concluded that for the purpose of enabling rinsed wafers W to acquire improved appearance, it is desirable to heighten the average linear velocity of purified water in the rinsing tank so as to cause the chemical liquid removed from the wafers W to be quickly displaced and discharged by the purified water and effect early stop of the reaction of the chemical liquid with the wafers W where the amount of purified water to be fed is fixed.

The cross-sectional area of the rinsing tank, therefore, is desired to be the irreducible minimum necessary for permitting immersion of the basket holding wafers W therein in the purified water to be attained by a simple procedure. Since this rinsing tank obtains a flow of purified water at a high average linear velocity with a small amount of purified water, it can provide efficient rinse with great quickness.

Incidentally, the number of rinsing tanks (number of stages of rinsing process) which is necessary for thorough rinse must be determined empirically, because it depends on the amount of chemical liquid remaining on the wafers W and the flow volume of purified water fed through the spouting nozzles.

Further, for the purpose of attaining uniform feed f purified water from the head tank to the rinsing tank, it is desirable to use three or more purified water feed pipes 14 and dispose them in a pattern encircling the basket.

By feeding purified water from the head tank to the rinsing tanks at a high linear velocity and uniformly as described above, the number of rinsing tanks and the amount of purified water to be fed through the spouting nozzles can be decreased.

Test Example 3 and Comparative Example 1

One and the same apparatus for rinse shown in FIG. 1 was used to compare the method of rinse with purified water fed from a head tank according to this invention and the conventional method of rinse by manual shaking were compared.

In the method of this invention, the feed of purified water from the head tank 11 to the rinsing tank 1 was effected in the manner of the case of (2) mentioned above with the total amount of purified water fed from the head tank 11 per batch fixed at 25 liters and the time of feeding at 15 seconds (average linear velocity=1.33 cm/sec.) and the other rinsing conditions equalized to those used in Test Example 1.

In the conventional rinsing method resorting to manual shaking, the rinsing tank 1 was filled to capacity with purified water preparatorily. The purified water was fed through the spouting nozzles 4 under the same conditions as in Test Example 1 and the basket 51 immersed in the purified water in the rinsing tank 1 was vertically shaken manually a total of ten times for a period of 15 seconds. The feed of purified water through the spouting nozzles 4 was continued while the manual shaking of the basket lasted. The other rinsing conditions were equalized with those used in the method of this invention.

Figure 4:
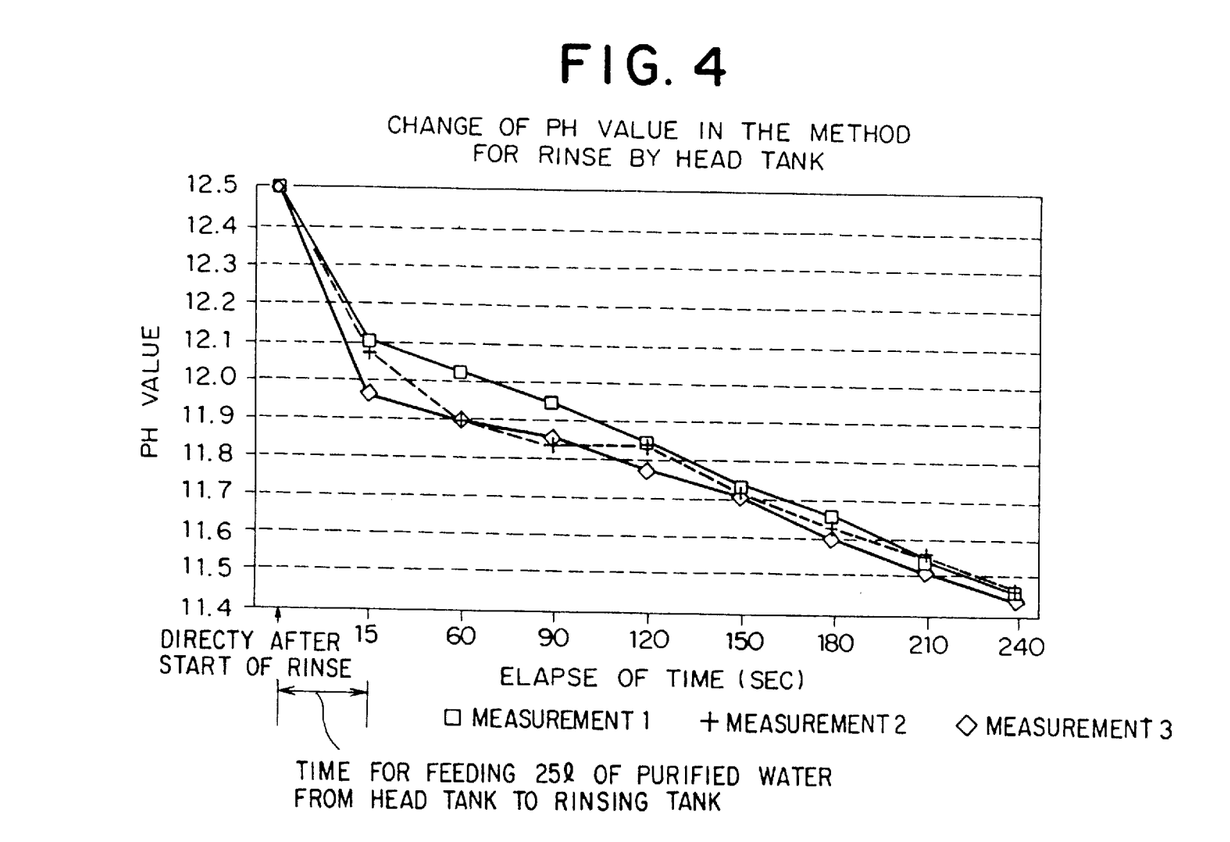
FIG. 4 is a graph showing the results of a rinsing operation according to the method of this invention.
Figure 5:
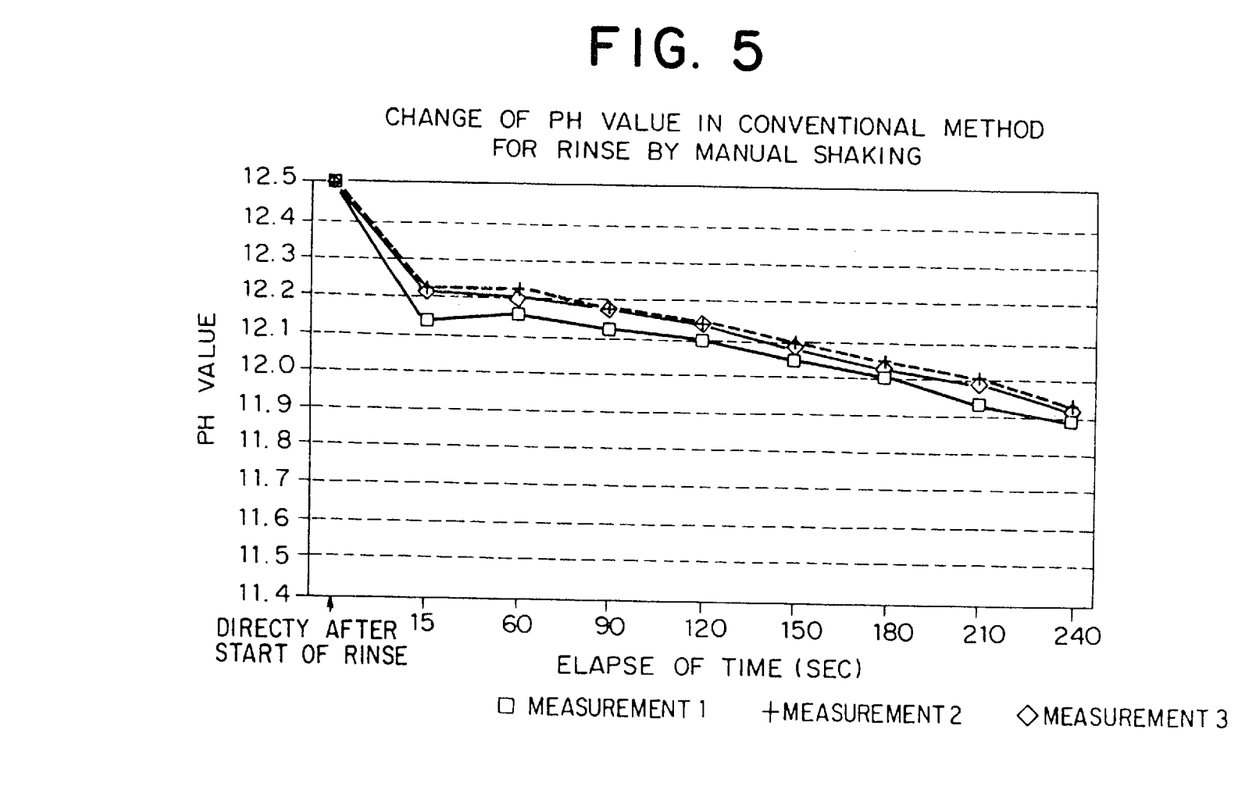
FIG. 5 is a graph showing the results of a rinsing operation according to the conventional method.

In each rinsing method, the relation between the elapse of time after the start of rinse and the pH value of the purified water in the rinsing tank 1 (the pH value measured at a depth of 10 cm from the surface of the overflow liquid) was determined. The results are shown in FIG. 4 and FIG. 5.

It is clearly noted from these diagrams that the method of this invention (FIG. 4) brought about a quick decrease of the pH value as compared with the method of manual shaking (FIG. 5), indicating that the former method excelled the latter method in the effect of rinse. The reason for this quick decrease of pH value may be given by a postulate that this invention enables the water defiled by the chemical liquid to be displaced and discharged in the form of overflow quickly and efficiently by causing a generous amount of purified water to be fed in a short time from the lower part of the rinsing tank and pushed upward in a fixed direction, whereas the manual rinsing suffers the chemical liquid adhering to the wafers to be diffused throughout the whole interior of the rinsing tank by the action of rinse and, with only the amount of purified water fed through the spouting nozzles, does not easily enable the water defiled by the chemical liquid to be displaced by the newly fed purified water and discharged quickly out of the rinsing tank. In the diagram of FIG. 4, the mark of "15 seconds" on the horizontal axis represents the point of time at which the feed of purified water from the head tank is completed.

EXAMPLE 2

Figure 2:
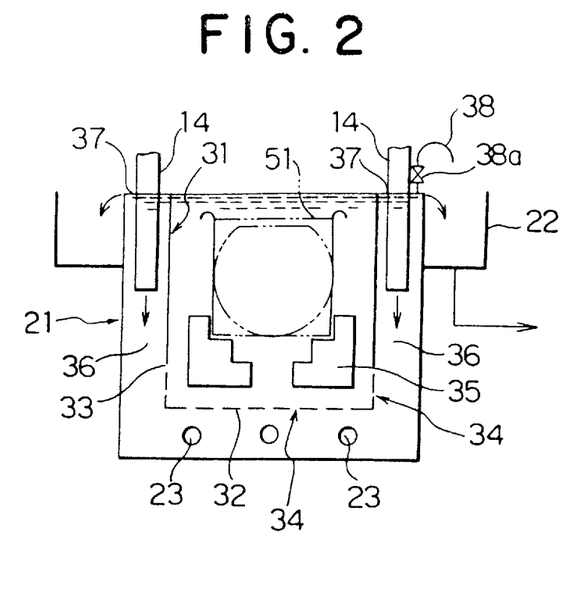
FIG. 2 is a cross section illustrating schematically another example of an apparatus for rinse to be used in embodying this invention.

FIG. 2 is a schematic cross section of a rinsing tank to be used for the method of rinse according to this invention. This rinsing tank is composed of an outer tank body 21 provided in the upper part thereof with an overflow discharge part 22 for spent rinsing liquid and near the bottom part thereof with spouting nozzles 23 for purified water and an inner tank body 31 provided in a bottom plate 32 thereof and in the lower end part of a peripheral wall 33 thereof with opening parts 34 and furnished with a retaining member 35 for retaining a basket 51 having stowed therein wafers W to be rinsed.

The tank body 31 is inserted in the tank body 21 and the bottom plate 32 is positioned directly above the spouting nozzles 23. The upper end of partitioned chamber 36 formed between the inner peripheral surface of the tank body 21 and the outer peripheral surface of the tank body 31 is closed with a plate member 37. An air vent tube 38 is projected from the plate member 37 and is provided with a switch valve 38a.

A head tank for feeding purified water (not shown) is disposed directly above the rinsing tank and is provided with purified water feed pipes 14. The lower end parts of these purified water feed pipes 14 are inserted into the partitioned chamber 36 to about one half of the depth of the inner tank body 31.

This rinsing tank enjoys an improved efficiency of use of purified water as compared with the rinsing tank 1 shown in FIG. 1 because the purified water from the head tank is caused to flow down the partitioned chamber 36 and then fed through the opening parts 34 to the inner tank body 31 together with the purified water from the spouting nozzles 23 and, as a result, the purified water from the head tank cannot interfere with smooth flow of the overflow liquid near the surface of liquid in the rinsing tank.

EXAMPLE 3

Figure 6:
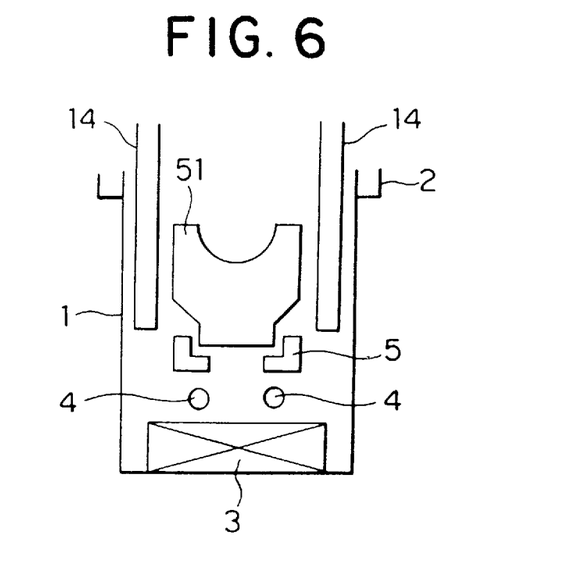
FIG. 6 is a cross section illustrating schematically one example of a rinsing tank according to this invention.
Figure 7:
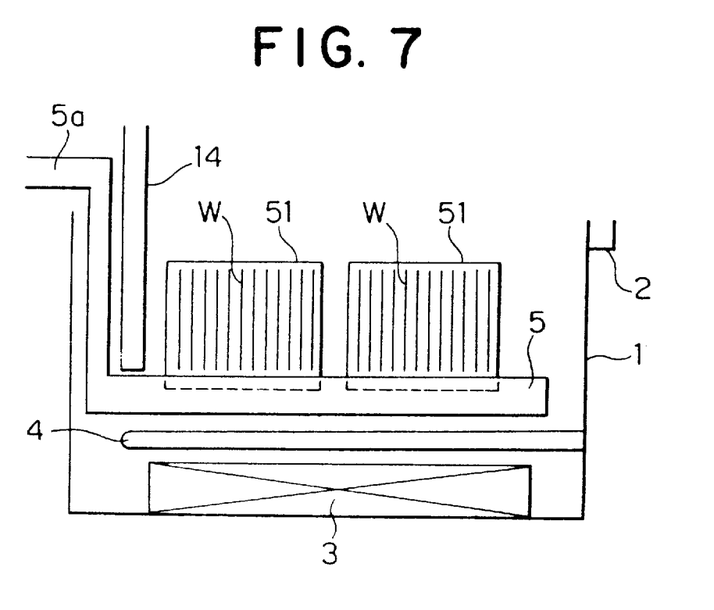
FIG. 7 is a side view of the rinsing tank of FIG. 6.
Figure 8:
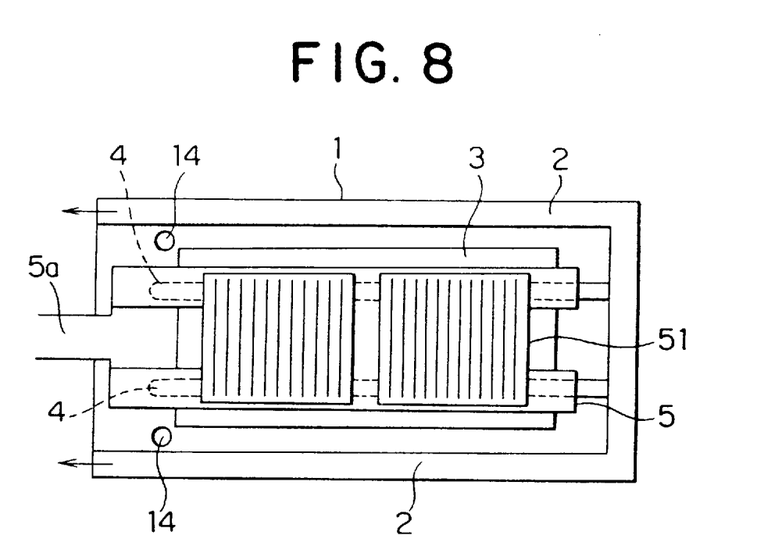
FIG. 8 is a plan view of the rinsing tank of FIG. 6.

FIG. 6 is a cross section schematically illustrating another example of the rinsing tank according to this invention, FIG. 7 a side view of the rinsing tank, and FIG. 8 a plan view thereof. In this rinsing tank 1, a retaining member 5 is formed at the leading end part of an arm 5a, two spouting nozzles 4 are disposed along the retaining member 5, two purified water feed pipes 14 are disposed in a vertical direction near the inner peripheral surface of the rinsing tank 1, and the lower end parts of the purified water feed pipes 14 are disposed near the retaining member 5.

EXAMPLE 4

Figure 9:
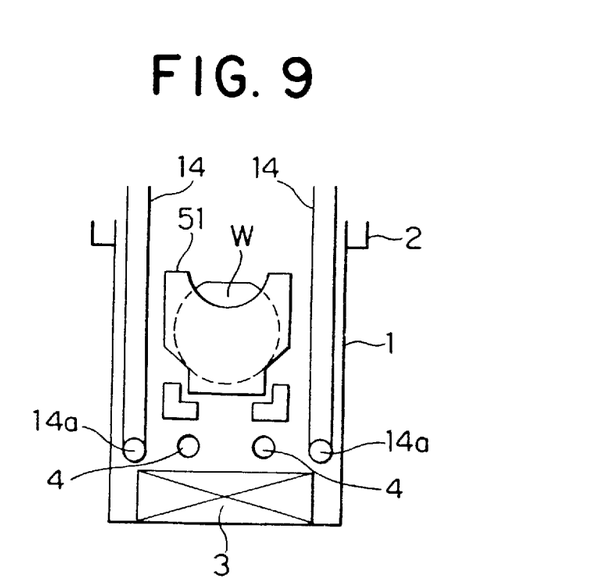
FIG. 9 is a cross section illustrating schematically another example of a rinsing tank according to this invention.
Figure 10:
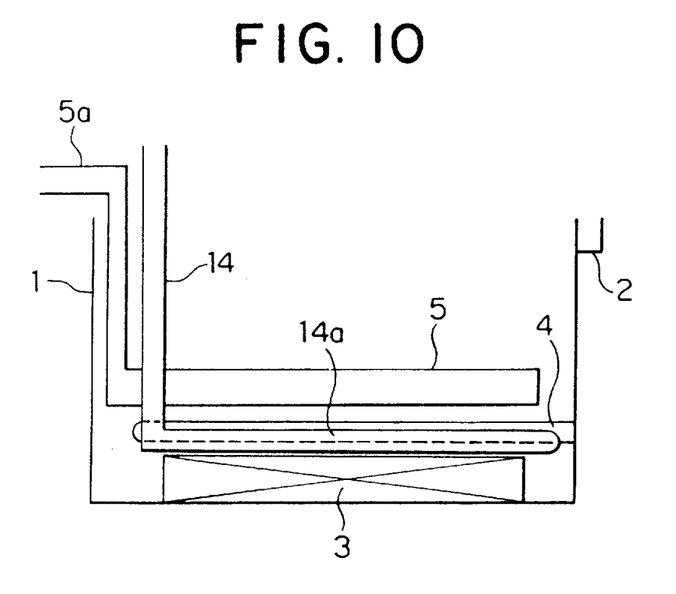
FIG. 10 is a side view of the rinsing tank of FIG. 9.
Figure 11:
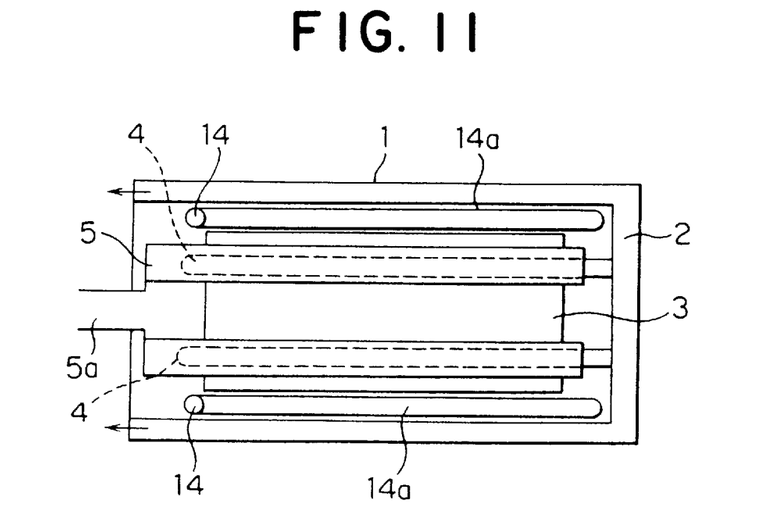
FIG. 11 is a plan view of the rinsing tank of FIG. 9.

FIG. 9 is a cross section illustrating schematically yet another example of the rinsing tank according to this invention, FIG. 10 is a side view of the rinsing tank, and FIG. 11 is a plan view thereof. In this rinsing tank 1, nozzle pipes 14a are extended in a horizontal direction one each from the leading end parts of the purified water feed pipes 14 and these nozzle pipes 14a are disposed near the spouting nozzles 4 and parallelly thereto.

EXAMPLE 5

Figure 12:
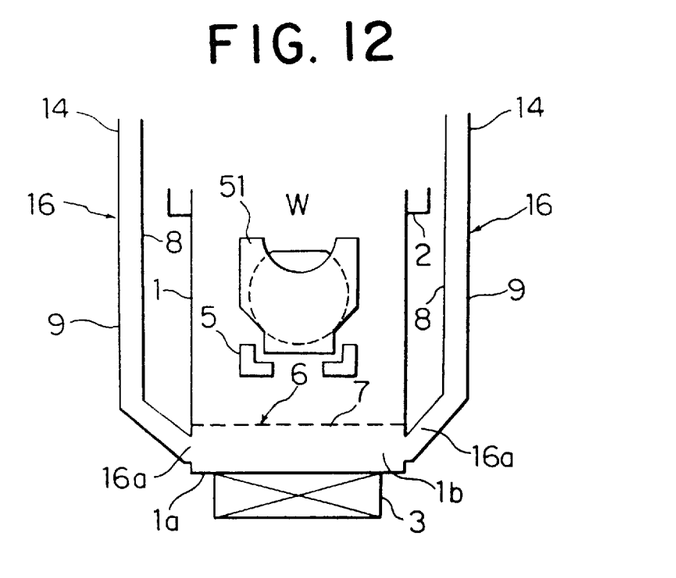
FIG. 12 is a cross section illustrating schematically yet another example of a rinsing tank according to this invention.
Figure 13:
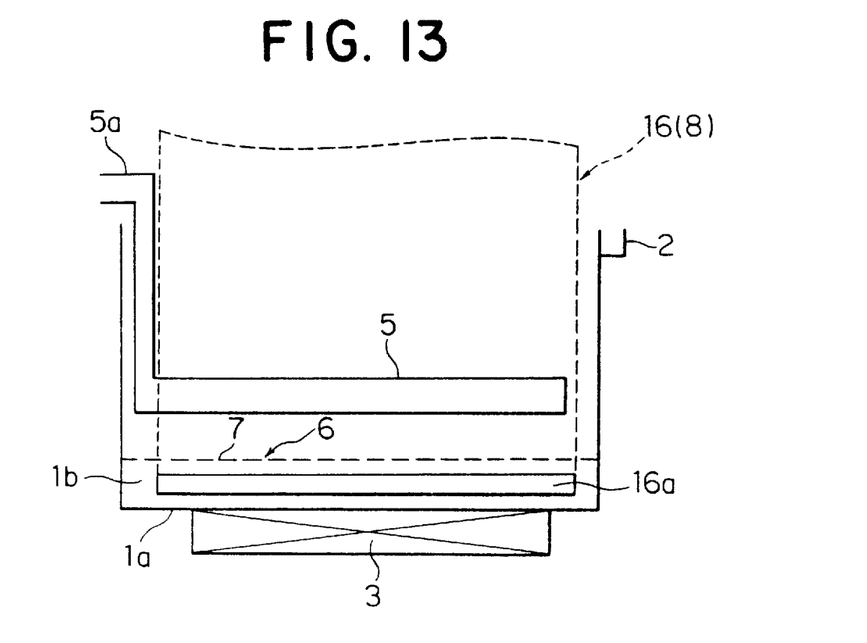
FIG. 13 is a side view of the rinsing tank of FIG. 12.
Figure 14:
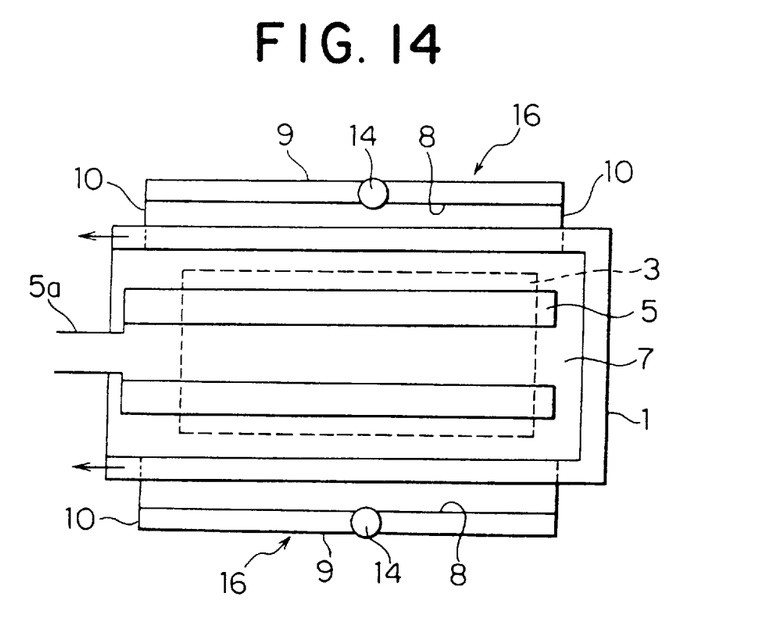
FIG. 14 is a plan view of the rinsing tank of FIG. 12.

FIG. 12 is a cross section illustrating schematically still another example of the rinsing tank according to this invention, FIG. 13 a side view of the rinsing tank, and FIG. 14 a plan view thereof. In this rinsing tank 1, the spouting nozzles 4 used in the example of FIG. 9 are omitted, a spouting plate 7 having a multiplicity of spouting orifices 6 formed therethrough (such as, for example, a punched board) is formed directly above the bottom plate 1a of the rinsing tank I and parallelly (in a horizontal direction) to the bottom plate 1a so as to have a partitioned chamber 1b defined by the spouting plate 7, the bottom plate 1a, and the peripheral wall of the rinsing tank 1, and two purified water feed members 16 are opposed to each other and adapted to communicate with the laterally opposite end parts of the partitioned chamber 1b.

The purified water feed members 16 are each constructed in the form of a duct of a small width with opposed plate members 8 and 9 and a lateral plate 10. The upper half parts of the purified water feed members 16 are made to communicate with the purified water feed pipes 14 laid in a vertical direction, the lower half parts thereof are bent toward the rinsing tank 1, and the lower end parts thereof are made to communicate with opening parts 16a formed in the peripheral wall of the partitioned chamber 1b. The width of the purified water feed members 16 is equal to the length of the opening parts 16a (the size in the lateral direction in the bearings of FIG. 13) and the length of the opening parts 16a is substantially equal to the length of the spouting plate 7. The ultrasonic oscillator 3 is disposed directly below the bottom plate 1a mentioned above.

In this rinsing tank 1, the purified water from the purified water feed pipes 14 flows to the purified water feed members 16 in such a manner as to fill them to capacity, enters the partitioned chamber 1b via the opening parts 16a, and advances through the spouting orifices 6 of the spouting plate 7 upward in the direction of the wafers W. In this case, the rinse is attained with high uniformity and precision because the purified water is rectified within the purified water feed members 16 and advanced through the opening parts 16a provided substantially throughout the entire length of the rinsing tank 1 and, as a result, fed at a uniform flow rate to all the wafers W in the rinsing tank 1.

EXAMPLE 6

Figure 15:
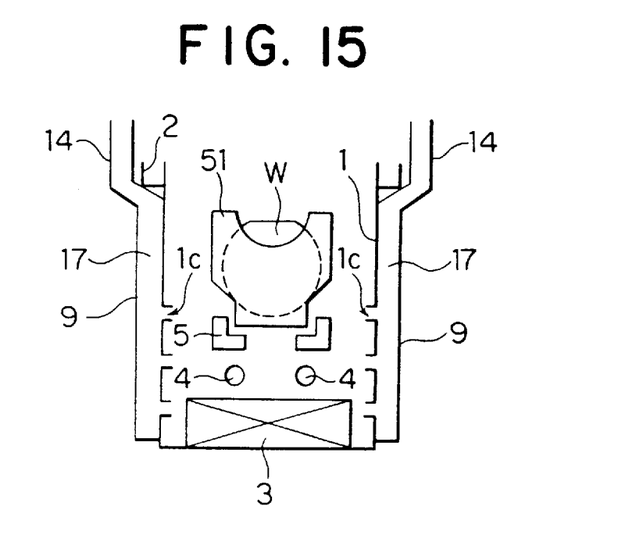
FIG. 15 is a cross section illustrating schematically still another example of a rinsing tank according to this invention.
Figure 16:
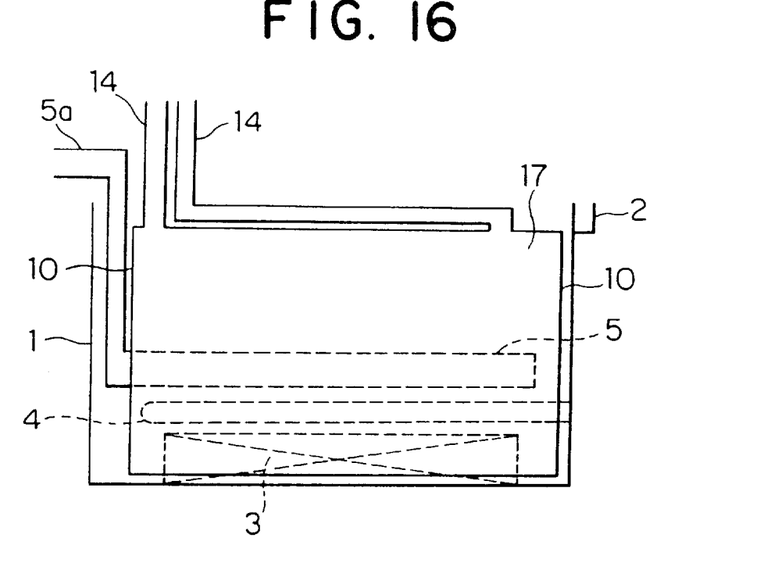
FIG. 16 is a side view of the rinsing tank of FIG. 15.
Figure 17:
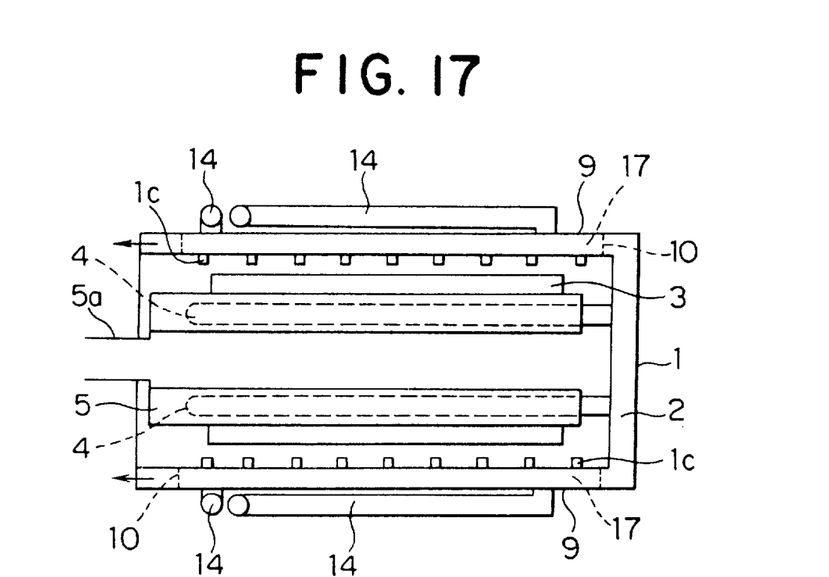
FIG. 17 is a plan view of the rinsing tank of FIG. 15.

FIG. 15 is a cross section illustrating schematically yet another example of the rinsing tank according to this invention, FIG. 16 a side view of the rinsing tank, and FIG. 17 is a plan view thereof. In this rinsing tank 1, a multiplicity of nozzles 1c are formed in the lower half part of the peripheral wall of the rinsing tank 1 substantially throughout the entire length of the peripheral wall as shown in FIG. 17, two purified water feed members 17 each formed in the shape of a duct with the peripheral wall, the plate member 9 disposed outside the peripheral wall, and the lateral plate 10 are disposed in a vertical direction as opposed to each other, and the purified water feed pipes 14 are made to communicate with the laterally opposite end parts of the upper part of the purified water feed members 17.

In this rinsing tank 1, the purified water from the purified water feed pipes 14 flows to the purified water feed members 17 in such a manner as to fill them to capacity, enters the rinsing tank 1 via the nozzles 1c, and advances upward in the direction of the wafers W. In this case, the rinse is attained with high uniformity and precision similarly to Example 5 because the purified water is rectified within the purified water feed members 17 and advanced through the multiplicity of nozzles 1c provided substantially throughout the entire length of the rinsing tank 1 and, as a result, fed at a uniform flow rate to all the wafers W in the rinsing tank 1.

As clearly remarked from the description given above, the first aspect of this invention enables wafers to be rinsed efficiently by causing purified water from a head tank to be fed upward by virtue of head at a high flow rate to the wafers held upright and parallelly to one another in a basket set in a rinsing tank thereby allowing the chemical liquid removed from the wafers to be quickly discharged out of the rinsing tank. As a result, this method of rinse allows a generous saving in the expense of equipment and that of labor by decreasing the defilement of the surfaces of wafers due to poor rinse and reducing the number of rinsing tanks which would be copiously required in the case of the conventional method of rinse resorting to manual shaking. It is further at an advantage in obtaining inexpensively an apparatus for rinse necessary for embodying the method by simply disposing a head tank above the existing rinsing tank and laying pertinent pipes as required.

The second aspect of this invention enables wafers to be rinsed quickly with high precision by the use of only a small amount of purified water.

The third aspect of this invention permits prevention of the occurrence of an uncalled-for reaction between the chemical liquid remaining in the rinsing liquid and wafers W being rinsed.

According to the fourth, fifth, eighth or ninth aspect of this invention, the purified water introduced from the head tank via the purified water feed pipes to the rinsing tank advances to the bottom part of the rinsing tank and changes the direction of flow thereof upward, the head between the head tank and the outlet of the purified water feed pipe directly contributes to increase the linear velocity of the upward flow of the purified water mentioned above, and the chemical liquid removed from the surfaces of wafers is quickly displaced with the purified water.

The sixth aspect of this invention enhances the effect of rinse because the purified water from the opening parts in the bottom plate of the inner tank body forms an upward flow and the purified water from the opening parts in the lower part of the peripheral wall of the inner tank body forms an upward flow.

The seventh aspect of this invention enables the rinse to be effected to an exalted degree because the effect of rinse with purified water fed at a high flow rate is coupled with the effect of rinse with purified water fed through spouting nozzles.

While there have been shown and described preferred embodiments of the present invention, it is to be distinctly understood that the invention is not limited thereto, but may be otherwise variously embodied and practiced within the scope of the following claims.

What is claimed is:

1. An apparatus for rinsing wafers characterized by comprising a head tank for retaining purified water for rinse, a rinsing tank provided in the upper part thereof with an overflow discharge part for spent rinsing liquid, and purified water feed pipes for feeding purified water endowed with head from said head tank to said rinsing tank, wherein a perforated spouting plate is formed in the horizontal direction in the lower part of said rinsing tank to give rise to a partitioned chamber in the bottom part of said rinsing tank and said purified water feed pines are made to communicate with said partitioned chamber.

2. An apparatus for rinsing wafers according to claim 1, which comprises a head tank for retaining purified water for rinse, a rinsing tank provided in the upper part thereof with an overflow discharge part for spent rinsing liquid, purified water feed pipes of which lower end parts are inserted into said rinsing tank for feeding purified water endowed with head from said head tank to said rinsing tank, and nozzle pipes disposed as extended from the leading end parts of said purified water feed pipes.

3. An apparatus for rinsing wafers characterized in that a rinsing tank is composed of a head tank for retaining purified water for rinse, an outer tank body provided in the upper part thereof with an overflow discharge part for spent rinsing liquid, and an inner tank body furnished on a bottom plate thereof with opening parts and provided with a retaining member for retaining therein a basket stowing wafers to be rinsed, said rinsing tank has said inner tank body inserted in said outer tank body, a partitioned chamber is formed between the inner peripheral surface of said outer tank body and the outer peripheral surface of said inner tank body, the lower end parts of purified water feed pipes for feeding purified water by virtue of head from said head tank are disposed as inserted into said partitioned chamber, and flow paths for purified water are formed as extended from said purified water feed pipes through the upper part of said partitioned chamber, the bottom part of said partitioned chamber, and the opening parts of the bottom plate of said inner tank body to the upper part of said inner tank body.

4. An apparatus for rinsing wafers according to claim 3, wherein opening parts are formed in the lower end part of the peripheral-wall of said inner tank body in addition to the opening parts formed in the bottom plate of said inner tank body.

5. An apparatus for rinsing wafers according to claim 3, wherein spouting nozzles for spouting purified water are provided between the bottom plate of said outer tank body and the bottom plate of said inner tank body.

* * * * *